US009251894B2

(12) United States Patent
Kilmer et al.

(10) Patent No.: US 9,251,894 B2
(45) Date of Patent: Feb. 2, 2016

(54) ACCESSING A RESISTIVE MEMORY STORAGE DEVICE

(71) Applicant: International Business Machines Corporation, Armonk, NY (US)

(72) Inventors: Charles A. Kilmer, Essex Junction, VT (US); Kyu-hyoun Kim, Mount Kisco, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/466,335

(22) Filed: Aug. 22, 2014

(65) Prior Publication Data

US 2015/0357033 A1 Dec. 10, 2015

Related U.S. Application Data

(63) Continuation of application No. 14/295,509, filed on Jun. 4, 2014.

(51) Int. Cl.
*G11C 5/06* (2006.01)
*G11C 13/00* (2006.01)
(Continued)

(52) U.S. Cl.
CPC .......... *G11C 13/0026* (2013.01); *G11C 13/004* (2013.01); *G11C 5/02* (2013.01); *G11C 5/025* (2013.01); *G11C 5/06* (2013.01); *G11C 13/0002* (2013.01); *G11C 13/003* (2013.01); *G11C 13/0004* (2013.01); *G11C 13/0007* (2013.01);
(Continued)

(58) Field of Classification Search
CPC .......... G11C 13/0069; G11C 13/0007; G11C 13/0002; G11C 13/004; G11C 13/0004; G11C 13/003; G11C 2213/79; G11C 5/06; G11C 5/025; G11C 5/02
USPC .............................. 365/148, 51, 63, 158, 163
See application file for complete search history.

(56) References Cited

U.S. PATENT DOCUMENTS 6,137,711 A 10/2000 Tan
6,757,191 B2 6/2004 Ooishi et al.
(Continued)

OTHER PUBLICATIONS

Chaudhuri et al., "High Density Asynchronous LUT Based on Non-Volatile MRAM Technology", 2010 International Conference on Field Programmable Logic and Applications (FPL), pp. 374-379, © 2010 IEEE, ISSN: 1946-1488. DOI: 10.1109/FPL.2010.80.
(Continued)

*Primary Examiner* — Ly D Pham
(74) *Attorney, Agent, or Firm* — Robert Williams; Richard A. Wilhlem

(57) ABSTRACT

Embodiments of the present disclosure describe a device and methods of accessing the device. The device can include a plurality of memory cells, each cell including a plurality of resistive memory components each designed to store data as resistance and an access transistor configured to control access to the plurality of resistive memory components. A wordline is configured to enable access to the set of resistor memory components by enabling the access transistor. A plurality of bitlines are each connected to a respective and different set of resistive memory components from each of the plurality of memory cells. A bitline controller is configured to access the plurality of resistive memory components by applying a first voltage to a first set of the plurality of bitlines and a second voltage to a second set of bitlines.

6 Claims, 5 Drawing Sheets

(51) Int. Cl.
  *G11C 5/02* (2006.01)
  *G11C 7/00* (2006.01)
  *G11C 7/12* (2006.01)

(52) U.S. Cl.
  CPC ........ *G11C 13/0069* (2013.01); *G11C 2213/79* (2013.01)

(56) References Cited

U.S. PATENT DOCUMENTS

| | | | |
|---|---|---|---|
| 7,209,383 B2 | 4/2007 | Dray et al. | |
| 7,324,366 B2 | 1/2008 | Bednorz et al. | |
| 7,397,689 B2 | 7/2008 | Liu et al. | |
| 7,710,755 B2 | 5/2010 | Terzioglu et al. | |
| 7,968,876 B2 | 6/2011 | Lung et al. | |
| 2003/0161180 A1 | 8/2003 | Bloomquist et al. | |
| 2003/0235070 A1* | 12/2003 | Ooishi | 365/158 |
| 2004/0057276 A1* | 3/2004 | Nejad et al. | 365/158 |
| 2005/0162883 A1* | 7/2005 | Nejad et al. | 365/63 |
| 2005/0212022 A1 | 9/2005 | Greer et al. | |
| 2008/0049487 A1* | 2/2008 | Yoshimura et al. | 365/148 |

OTHER PUBLICATIONS

Kilmer et al., "Accessing a Resistive Memory Storage Device", U.S. Appl. No. 14/295,509, filed Jun. 4, 2014.
List of IBM Patents or Patent Applications Treated as Related.

\* cited by examiner

ACCESSING A RESISTIVE MEMORY STORAGE DEVICE

BACKGROUND

The present disclosure relates to memory devices that store data based on resistance value, and more specifically, to multiple resistive memory components sharing a single access transistor. As memory density increases, need for new memory technology other than dynamic random access memory (DRAM) is increasing, as DRAM technology scaling is facing a wall due to various problems including retention time. There are emerging memory devices that store data as resistance values. For example, phase change memory (PCM), magnetic random access memory (MRAM), spin-torque-transfer magnetic random access memory (STT_MRAM), and resistive random access memory (ReRAM) all use variation of resistance. These memory cells can be composed of one access transistor and one resistive memory component. For these data storage devices, the access transistor may also limit the scaling of the geometry and could be a bottleneck to achieve higher memory density.

SUMMARY

According to embodiments of the present disclosure, a device is disclosed that may include a plurality of memory cells. In various embodiments, each memory cell may include a plurality of resistive memory components each designed to store data as resistance and an access transistor configured to control access to the plurality of resistive memory components. The device may also include a wordline configured to enable access to the set of resistor memory components by enabling the access transistor. In addition, the device may include a plurality of bitlines, each bitline connected to a respective and different set of resistive memory components from each of the plurality of memory cells. Furthermore, the device may include at least one bitline controller configured to access the plurality of resistive memory components by applying a first voltage to a first set of the plurality of bitlines and a second voltage to a second set of bitlines.

According to embodiments of the present disclosure, a method is disclosed of accessing a resistive memory storage device having a plurality of bitlines, each bitline connected to a respective and different set of resistive memory components from a plurality of memory cells containing resistor memory components. In various embodiments, the method may include enabling an access transistor shared by a plurality of resistive memory components in a first memory cell of the plurality of memory cells by applying a wordline voltage applied to a wordline. The method may also include writing a first set of logic values to a first set of the resistive memory components by applying a first bitline voltage to a first set of the plurality of bitlines. Furthermore, the method may include maintaining a second set of logic values for a second set of the resistive memory components by applying a second bitline voltage to a second set of the plurality of bitlines.

According to embodiments of the present disclosure, a method is disclosed of accessing a resistive memory storage device having a plurality of bitlines, each bitline connected to a respective and different set of resistive memory components from a plurality of memory cells containing resistor memory components. In various embodiments, the method may include enabling an access transistor shared by a plurality of resistive memory components in a first memory cell of the plurality of memory cells by applying a wordline voltage applied to a wordline. The method may also include writing a first set of logic values to a first set of the resistive memory components by applying a first bitline voltage to a first set of the plurality of bitlines. In addition, the method may include maintaining a second set of logic values for a second set of the resistive memory components by applying a second bitline voltage, below a threshold voltage, to a second set of the plurality of bitlines. Furthermore, the method may include reading the first set of logic values and the second set of logic values from the plurality of resistive memory components by applying a common bitline voltage to the plurality of bitlines.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

DETAILED DESCRIPTION

Figure 1:
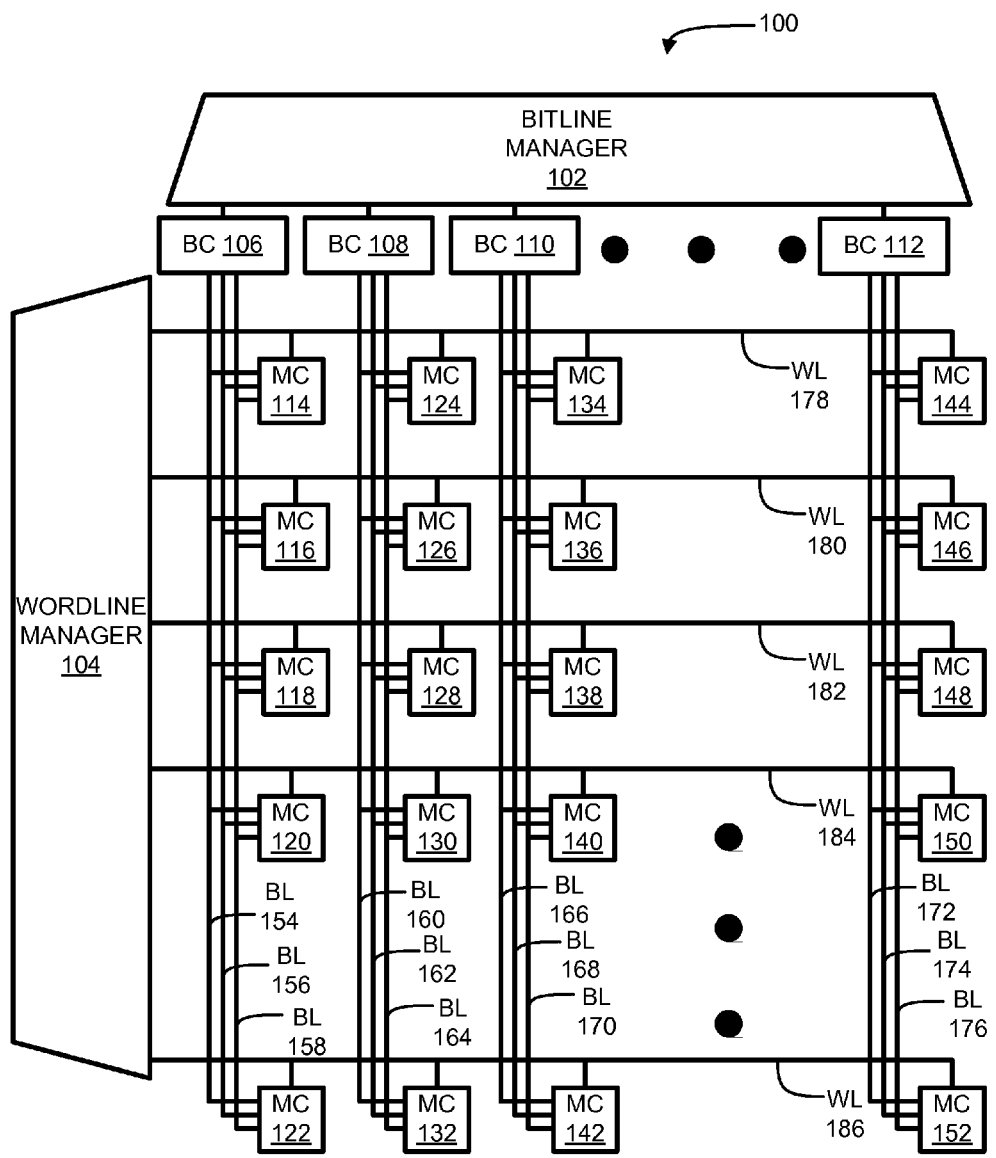
FIG. 1 depicts a high-level view of a data storage device that stores data as a resistance value, consistent with embodiments of the present disclosure

Aspects of the present disclosure relate to memory devices that store data based on resistance value, more particular aspects relate to multiple resistive memory components sharing a single access transistor. While the present disclosure is not necessarily limited to such applications, various aspects of the disclosure may be appreciated through a discussion of various examples using this context.

Various embodiments of the present disclosure are directed toward a data storage device comprised of multiple memory cells and bitline controllers. Each memory cell can include multiple resistive memory components sharing one access transistor and the bitline controllers can be configured to perform read and write operations on the multiple resistive memory components. The bitline controllers can perform the read operation by applying a common voltage to bitlines that are electrically connected to the resistive memory components. The bitline controllers can perform the write operation by applying two different voltages to two different sets of bitlines. The first voltage can meet or exceed a threshold voltage that changes the resistance on a first set of the resistive memory components enough to store logical data values on the resistive memory components. For example, PCM components can be written to by applying a current voltage (IV) pulse that sets the resistive phase change material to either crystalline or amorphous phase. The second voltage, on the other hand, can be below the threshold voltage such that, the existing resistance is effectively maintained on a second set of the resistive memory components. As discussed in more detail herein, the use of a single access transistor for multiple memory components can result in unwanted current flow between the first and second set of resistive memory components during such a write operation. This current can potentially change the resistance of the resistive memory components in the separate memory cells enough to store logical data values and possibly, cause data corruption and system errors. Therefore, the second voltage does not result in a write operation on the second set of resistive memory components. Accordingly, the second voltage can be set at a value that can reduce current that would otherwise propagate through the second set of resistive memory components due to the difference between the first and second first voltages. For example, the second voltage can be set at a value that is sufficient to maintain the current state of PCM components.

Embodiments of the present disclosure will now be described more fully hereinafter with reference to the accompanying figures. However, there can be several embodiments of the present invention and should not be construed as limited to the embodiments set forth. The embodiments disclosed are provided so that this disclosure can fully convey the scope of the invention to those skilled in the art. Therefore, the following detailed description is not to be taken in a limiting sense.

FIG. 1 depicts a high-level view of a data storage device 100 that stores data as a resistance value, consistent with embodiments of the present disclosure. As shown, the device 100 can include a bitline manager 102, a wordline manager 104, bitline controllers 106, 108, 110, 112, and memory cells 114-152. Electrically connecting the bitline manager 102 and the bit controllers 106, 108, 110, 112 to the memory cells 114-152 are bitlines 154-176. Electrically connecting the wordline manager 104 to the memory cells 114-152 are wordlines 178, 180, 182, 184, and 186.

According to certain embodiments, each memory cell can include an access transistor (not shown in FIG. 1) shared by multiple resistive memory components (not shown in FIG. 1). To perform a read or write operation on memory cell 114, the location of the memory cell within the array is determined and the wordline manager 104 is used to apply a voltage to wordline 178. The applied voltage enables the access transistors along wordline 178 and enables access to the resistive memory components of memory cell 114.

Bitline manager 102 can be used to select one or more bitlines within the target memory cell 114. The bitline controller 106 can be configured to apply access voltages to the appropriate bitlines. For example, stored data can be read from each memory component in memory cell 114 by applying a common voltage to bitlines 154, 156, and 158. The resistance of each resistive memory component in memory cell 114 can be measured in order to determine the stored value. Similar to how an electrical charge stored on a capacitor determines whether a logical data value stored is 0 or 1, for resistive memory components, the resistance determines the logical data value that is stored. Although the various embodiments herein are discussed in terms of binary values, some resistive memory components may be designed to store more than two, binary, values.

As discussed herein, the use of a single access transistor for multiple resistive memory components can result in unwanted current on the bitlines. This current can be caused by a resistor divider network that is formed by the multiple resistive memory components. For instance, the unwanted current can result from voltage differentials caused because cells not being accessed may not have their access transistor active. The unwanted current can also result from differences in bitline voltages, such as when only certain bitlines are being accessed. The use of a common voltage on bitlines 154, 156, and 158, during a read operation, can result in the voltage difference across resistive memory components (not shown in FIG. 1) included in memory cells 116, 118, 120, and 122 being low (at or close to zero). Therefore, current draw through memory cells 116, 118, 120, and 122 can be low (at or close to zero).

Consistent with embodiments of the present disclosure, the bitline controller 106 can be configured to write data to a first subset of resistive memory components but not a second subset, by applying a first voltage to the first subset of bitlines and a second voltage to the remaining (second subset of) bitlines. The various different possible types of resistive memory components that can be used in memory cell 114 can be configured to change resistive value when a particular write voltage and current are applied to the resistive memory component. Furthermore, these resistive memory components can be further configured to maintain their resistive value when the voltage difference is minimal and the current propagating through is minimal (at or close to zero). This ability to change resistance at a particular voltage and allowing low levels of voltage and/or current flow without change, allows resistive memory components to be used for data storage, similar to a capacitors ability to store electrical charge. As used herein, a voltage that establishes a large enough voltage difference to change the resistance of the resistive memory component can be known as the threshold voltage. By meeting or exceeding the threshold voltage, a logical data value can be stored, thereby performing a write operation.

The bitline controller 106 can be configured to apply a first voltage that meets or exceeds the threshold voltage (when the corresponding access transistor is active) and a second voltage that is below the threshold voltage (regardless of whether or not the corresponding access transistor is active). By applying the first voltage to a first set of resistive memory components, a logical data value can be stored on the first set of resistive memory components. By applying the second voltage to a second set of resistive memory components the existing values stored on the second set of resistive memory components can be maintained. In this manner, if a logical data value has already been stored on some or all of the second set of resistive memory components during previous write operations, the logical data value stored can be unaffected by the second voltage.

According to various embodiments, the second voltage can be set in order to have a limiting effect on current that can propagate through memory cells 116, 118, 120, and 122. For example, bitline controller 106 applies the first voltage to bitline 158 that is sufficient to write to a corresponding resistive memory component within memory cells that have their access transistors enabled. Unless the remaining bitlines are set to a second, different voltage, the resistive memory components in the memory cells with active transistors enabled could be overwritten.

As discussed herein, the difference between the first voltage and the second voltage can result in a voltage drop across a set of resistive memory components included in memory cells that are not active (memory cells with inactive access transistors). If the voltage drop exceeds the threshold voltage for this set of resistive memory components, the set of resistive memory components can store data that was not intended to be stored. Therefore, bitline controller 106 can apply the second voltage to bitlines 154 and 156 that is designed to keep the voltage drop across the set of resistive memory components below the threshold voltage. Therefore, data will not be written to the set of resistive memory components included in memory cells that are inactive.

The read and write operations described are for illustration purposes only and can be similarly carried out using wordlines 180-186, bitline controllers 108-112, bitlines 160-176, and memory cells 124-152. Furthermore, multiple read and write operations can be performed on multiple memory cells electrically connected to multiple wordlines and bitlines.

Figure 2:
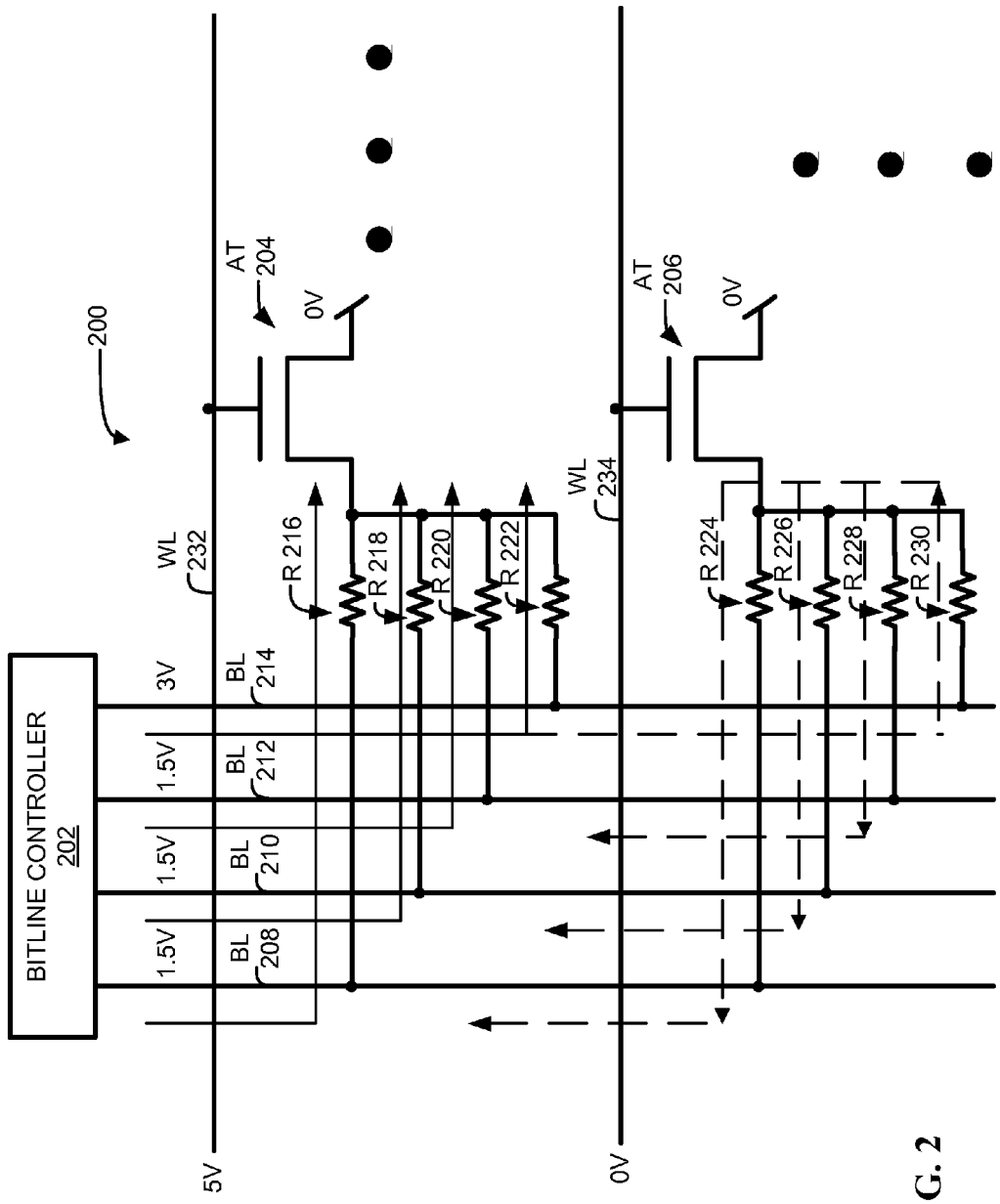
FIG. 2 depicts an example of writing a logic data '1' value to a memory cell of a data storage device that stores data as a resistance value, consistent with embodiments of the present disclosure.

FIG. 2 depicts an example of writing a logic data '1' value to a memory cell of a data storage device 200 that stores data as a resistance value, consistent with embodiments of the present disclosure. As shown, the storage device 200 can include bitline controller 202, access transistors 204,206, bitlines 208, 210, 212, 214, resistive memory components 216, 218, 220, 222, 224, 226, 228,230 and wordlines 232, 234. Additional memory cells can also form part of the memory device. These various memory cells can be consistent with the embodiments discussed in connection with FIG. 1 (e.g., memory cells 114-152).

In certain embodiments, a logic value (e.g., "1") can be written to one resistive memory component in a memory cell. For example, a 1 can be written to resistive memory component 222. As illustrated, 5V is applied to wordline 232 such that the access transistor 204 is enabled. Access transistor 204 can have a drain electrically connected to a drain voltage (e.g., 0V) and a source electrically connected to the resistive memory components 216, 218, 220, and 222. Therefore, access transistor 204 can enable access to the resistive memory components 216, 218, 220, and 222 in response to a voltage applied to wordline 232. Bitline controller 202 can apply a first voltage (e.g., 3V) to bitline 214 and a second voltage (e.g., 1.5V) to bitlines 208, 210, and 212.

With regards to the active memory cell corresponding to access transistor 204, both the first voltage and the second voltage can induce currents (shown in FIG. 2 as solid arrow lines) through resistive memory components that are electrically connected to their respective bitlines. As stated herein, to perform a write operation, a threshold voltage can be met or exceeded to establish a voltage difference across a resistive memory component. In this embodiment, the first voltage of 3V meets or exceeds this threshold voltage by creating a voltage difference of 3V across the resistive memory component 222 (relative to the drain voltage) and a 1 is written to resistive memory component 222. However, the second voltages of 1.5V result in a voltage drop across resistive memory components 216, 218, 220 that is below the threshold voltage. This can allow for the existing values stored on memory resistive components 216, 218, and 220 to be maintained.

Continuing with FIG. 2, 0V is applied to wordline 234 and the access transistor 206 is disabled (the access transistor 206 can appear as an open switch) and does not allow access to the resistive memory components 224, 226, 228, and 230. However, the voltage on bitline 214 is 3V and the voltage on bitlines 224, 226, and 228 is 1.5V. Therefore, a voltage difference is established across resistive memory components 224, 226, 228, and 230. This voltage difference can induce a current (shown in FIG. 2 as the dashed arrow lines) to flow through the resistive memory components 224, 226, 228, and 230. The current induced can be described by the formula:

$$I=(N-1)\times(V/2)/[R+R/(M-1)]=V/R\times 0.5\times(N-1)\times(M-1)/M$$

Where N is the number of memory cells for a set of bitlines, R is the resistance of a resistive memory component, V is the voltage difference across the resistive memory component, and M is the number of resistive memory components per memory cell.

Therefore, based on the formula, the current reaches zero when the voltage difference reaches zero. In this embodiment, the voltage difference is zero when a common voltage of 3V is applied to bitlines 208, 210, 212, and 214. However, at this voltage, a logical data value of 1 can be written to resistive memory components 216, 218, and 220. Therefore, a second voltage, in this case 1.5V, can be chosen that is below the threshold voltage and limits the current induced through resistive memory components 224, 226, and 228.

Writing a logical data value of 1 to resistive memory component 222 as described, is for illustration purposes only and can be similarly carried out on resistive memory components 216, 218, 220, 224, 228, and 230. Furthermore, a 1 can be written on multiple resistive memory components simultaneously. Moreover, the particular value "1" is arbitrary to the particular system and configuration (e.g., the resistive value associated with the write shown in FIG. 2 could represent a "0" or other value).

Figure 3:
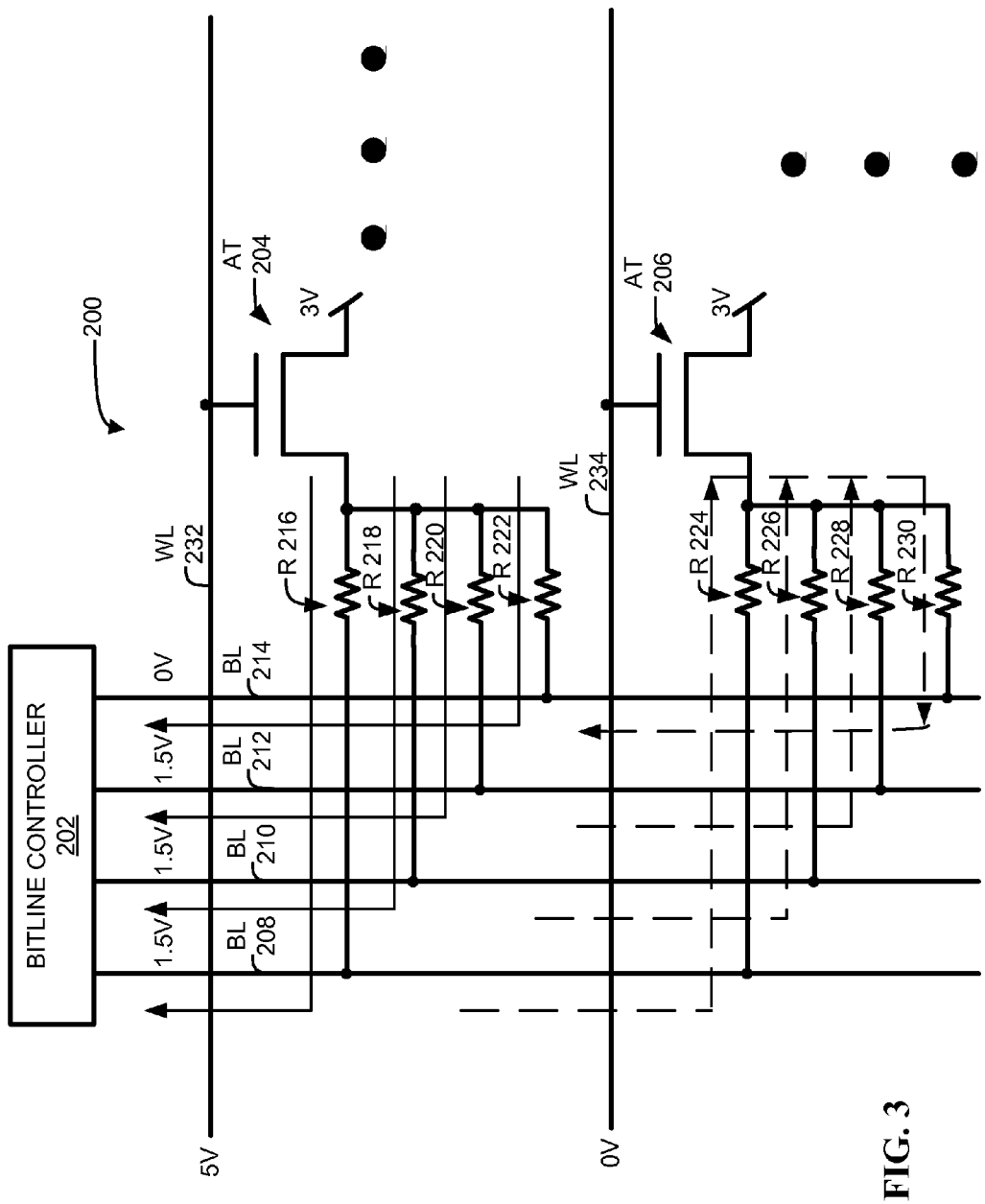
FIG. 3 depicts an example of writing a logic data '0' value to a memory cell of a data storage device that stores data as a resistance value, consistent with embodiments of the present disclosure.

FIG. 3 depicts an example of writing a logic data value '0' to a memory cell of a data storage device 200 that stores data as a resistance value, consistent with embodiments of the present disclosure. As shown, the storage device 200 can include bitline controller 202, access transistors 204,206, bitlines 208, 210, 212, 214, resistive memory components 216, 218, 220, 222, 224, 226, 228,230 and wordlines 232, 234.

Various embodiments allow for the storage device of FIG. 3 to be used in connection with the embodiments discussed in connection with FIGS. 1 and 2. For instance, certain types of resistive memory elements can have different values written depending upon the direction of an applied write voltage. Accordingly, FIG. 3 depicts the access transistors 204, 206 being connected to a positive voltage (e.g., 3V), relative to the corresponding voltage depicted in FIG. 2. For example, certain types of magnetic random access memory may store different values depending on the direction of applied current. Embodiments are understood to use different write mechanisms depending upon the specific type of resistive memory elements. For example, writing different values to PCM elements can be controlled using two different IC write pulses, one designed to create an amorphous PC state and another to create a crystalline PC state.

The voltages applied in FIG. 3 show a possible write operation. According to various embodiments, the write operation can be subject to similar current draw as discussed in connection with FIG. 2, albeit with a reversed direction of current flow. Accordingly, the current induced can be described by the formula discussed describing FIG. 2. Based on the formula, the current reaches zero when the voltage difference reaches zero.

According to particular embodiments, the second voltage is set to half of the voltage applied during a write operation. In the particular example shown in FIGS. 2 and 3, the second voltage is set to one half of 3V, which is 1.5V. This can be particularly useful for resistive memory elements that reverse the direction of an applied write voltage to write different values. In particular, this can allow for a second voltage (e.g., 1.5V) that can be applied independent of the value being written and the corresponding access transistor voltage.

Writing a logical data value of 0 to resistive memory component 222 as described, is for illustration purposes only and can be similarly carried out on resistive memory components 216, 218, 220, 224, 228, and 230. Furthermore, a 0 can be written on multiple resistive memory components simultaneously. Moreover, the particular value "0" is arbitrary to the particular system and configuration (e.g., the resistive value associated with the write shown in FIG. 3 could represent a "1" or other value).

Figure 4:
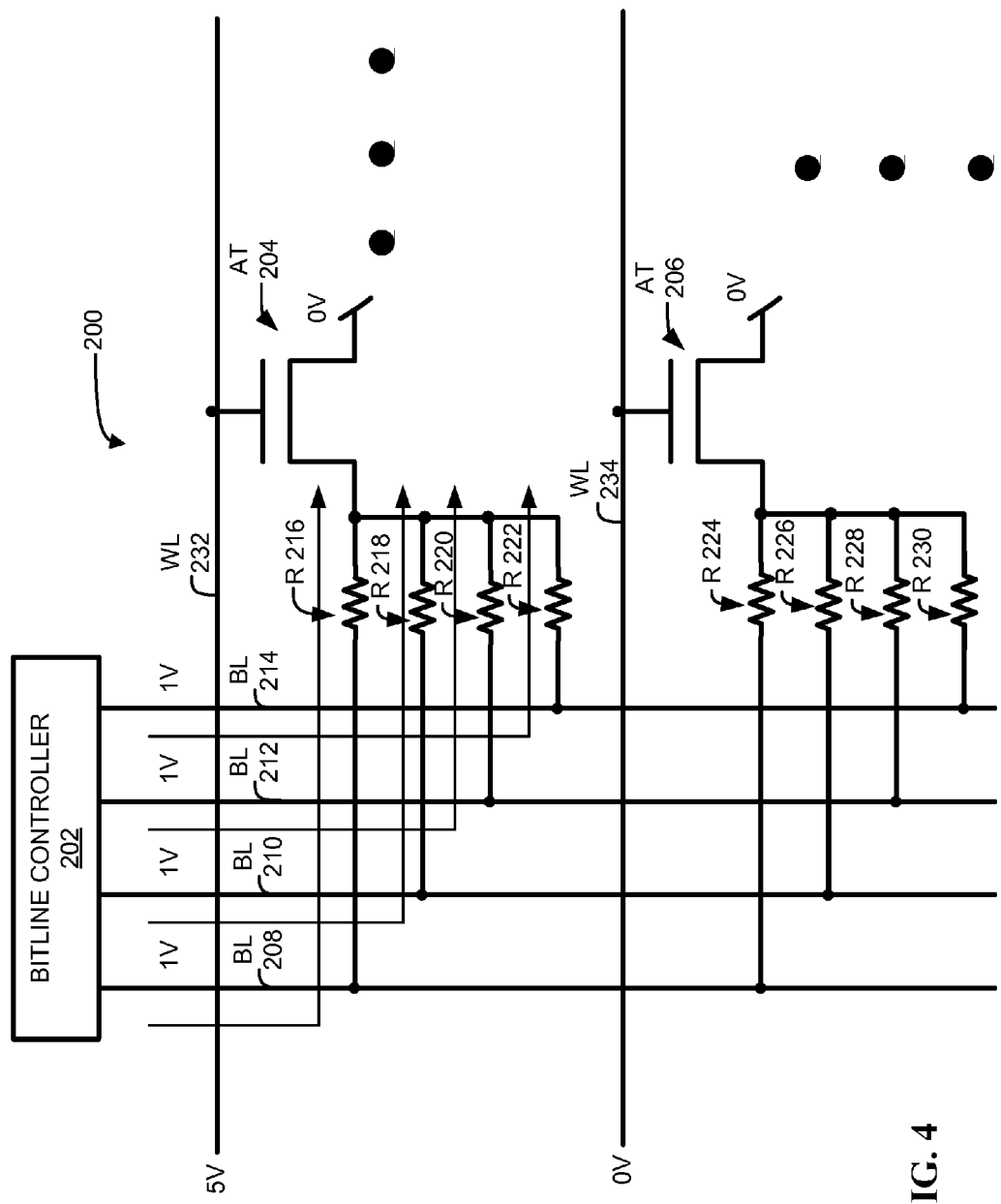
FIG. 4 depicts an example of reading from a memory cell of a data storage device that stores data as a resistance value, consistent with embodiments of the present disclosure.

FIG. 4 depicts an example of reading from a memory cell of a data storage device 200 that stores data as a resistance value, consistent with embodiments of the present disclosure. As shown, the storage device 200 can include bitline controller 202, access transistors 204,206, bitlines 208, 210, 212, 214, resistive memory components 216, 218, 220, 222, 224, 226, 228,230 and wordlines 232, 234.

In certain embodiments, one resistive memory component in a memory cell can be read. In this case, only resistive memory component 222 is desired to be read. However, to perform a read operation, a threshold voltage does not have to be met. Therefore, a common voltage can be applied that is below the threshold voltage and reads the resistive memory components 216, 218, and 220 as well. By applying a common voltage, an induced current propagating through other memory cells can be avoided.

As illustrated, 3V can be applied to wordline 232 such that the access transistor 204 is enabled. Access transistor 204 can have a drain electrically connected to a drain voltage of 0V and a source electrically connected to the resistive memory components 216, 218, 220, and 222. Therefore, access transistor 204 can enable access to the resistive memory components 216, 218, 220, and 222. Bitline controller 202 can then apply the common voltage of 1V to bitlines 208, 210, 212, and 214. The common voltage can induce currents (shown in FIG. 4 as solid arrow lines) through resistive memory components that are electrically connected to their respective bitlines. As stated herein, to perform a read operation, a threshold voltage does not have to be met or exceeded. Therefore, the resistive memory components 216, 218, 220, and 222 can be read and the logical data values of resistive memory components 216, 218, and 220 can be discarded.

Figure 5:
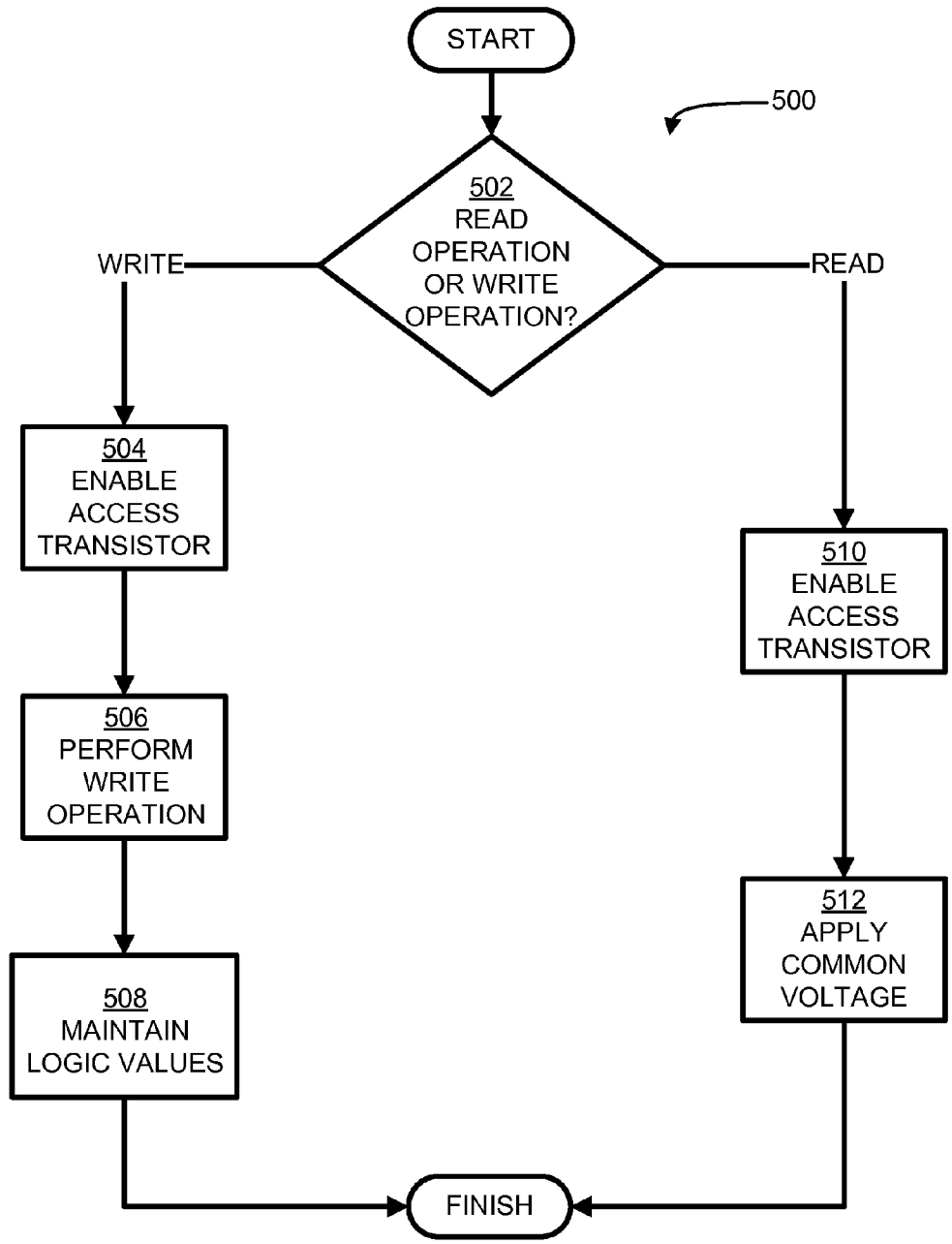
FIG. 5 depicts a method of accessing a resistive memory storage device, consistent with embodiments of the present disclosure While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

FIG. 5 depicts a method 500 of accessing a resistive memory storage device, consistent with embodiments of the present disclosure. In operation 502, it is determined whether a read operation or a write operation is to be performed on the plurality of resistive memory components. If a write operation is to be performed, in operation 504, an access transistor can be enabled. The access transistor can be configured to have a gate electrically connected to a wordline, a drain electrically connected to a drain voltage, and a source electrically connected to the plurality of resistive memory components. Therefore, a voltage applied to the wordline can enable the access transistor and activate the memory cell by allowing access to the plurality of resistive memory components.

In operation 506, a write operation can be performed. A first set of bitlines can be configured to be electrically connected to a first set of the plurality of resistive memory components. The first set of resistive memory components can be configured such that a threshold voltage can establish a voltage difference that can change the resistance of the first set of resistive memory components enough to store a logical data value on each component. By applying a first voltage that meets or exceeds the threshold voltage to the first set of bitlines, the voltage difference can be established across the first set of resistive memory components, thereby performing the write operation.

In various embodiments, the threshold voltage is dependent on the voltage connected to the drain of the access transistor. In certain embodiment, to perform the write operation, the first voltage can be greater than the drain voltage to establish the voltage difference across the components. In another embodiment, the first voltage can be less than the drain voltage. The write operations can be subject to a similar current draw, but with a reversed direction of current flow. The reversed direction can affect the logical data value written to the resistive memory components (e.g. 1 or 0). For example, if the first voltage is greater than the drain voltage, a 1 can be written to the resistive memory components. If the first voltage is less than the drain voltage, a 0 can be written.

In operation 508, a second set of logic values can be maintained. A second set of bitlines can be configured to be electrically connected to a second set of the plurality of resistive memory components and a second voltage can be applied to the second set of bitlines. As stated herein, a threshold voltage can be met or exceeded to change the resistance of the resistive memory components enough to perform a write operation. The threshold voltage is determined by the voltage difference and the voltage difference can depend on the drain voltage connected to the access transistor. Thus, the second voltage applied can be below the threshold voltage that establishes the necessary voltage difference across the resistive memory components to perform the write operation. Therefore, the logic values on the second set of resistive memory components can be maintained.

In various embodiments, the resistive memory storage device can be configured to have a plurality of memory cells that are electrically connected to a plurality of wordlines. In certain embodiments, if a voltage is not applied to a wordline the access transistors electrically connected to the wordline are configured to be disabled. Therefore, access is not enabled to the resistive memory components that share a disabled access transistor. However, the first voltage applied to the bitlines can establish a voltage difference across resistive memory components with a disabled access transistor. This voltage difference can induce an unwanted current to flow through the resistive memory components. Furthermore, if the first voltage meets or exceeds the threshold voltage for the resistive memory components, a write operation can be performed on the resistive memory components. Therefore, the second voltage can be applied to the bitlines that decreases the voltage difference across the resistive memory components and maintains the logical data values on the resistive memory components. In addition, with regard to the active memory cell, the second voltage applied can be between the first voltage and the drain voltage. Thus, the second voltage can remain constant, independent of the value being written.

If a read operation is to be performed on a resistive memory component, in operation 510, an access transistor can be enabled similar to operation 504. In operation 512, the resistive memory component is read. To perform a read operation, a threshold voltage does not have to be met. Therefore, a common voltage can be applied that is below the threshold voltage and reads the resistive memory components. By applying a common voltage, the logical data values can be read and maintained for the resistive memory components in the active memory cell. With regard to the inactive memory cells, the voltage difference across the resistive memory components that induces current to propagate through the resistive memory components, can be avoided.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A data storage device comprising:
a plurality of memory cells, each memory cell including:
a plurality of resistive memory components, each having a first and second terminal, the first terminal of each resistive memory component coupled with a respective one of a plurality of bit lines; and
an access transistor having a gate terminal, and first and second source/drain terminals, the gate terminal being coupled with a word line, and the first source/drain terminal being coupled with the second terminals of each of the plurality of resistive memory components of the memory cell, wherein the word line is configured to enable access to the resistive memory components of the memory cell by enabling the access transistor; and
a bit line controller coupled with each of first and second memory cells of the plurality of memory cells via a first set of two or more bit lines, wherein respective ones of the bit lines of the first set are coupled with a first terminal of a single resistive memory component in each of the first and second memory cells, wherein the bit line controller is configured to access a first resistive memory component in one of the first and second memory cells by applying a first voltage to a first bit line coupled with the first resistive memory component and a second voltage to a second bit line, wherein the first and second bit lines are included in the first set of two or more bit lines.

2. The data storage device of claim 1, wherein the bit line controller is configured to read stored data on the first resistive memory component by applying the second voltage to each of the second bit line and a third bit line, wherein the first, second, and third bit lines are included in the first set of two or more bit lines.

3. The data storage device of claim 1, wherein the resistive memory components are configured to store data in response to an applied voltage exceeding a threshold voltage, the first voltage exceeds the threshold voltage, and the second voltage is below the threshold value.

4. The data storage device of claim 1, wherein the second source/drain terminal is connected to a drain voltage and the second voltage is between the first voltage and the drain voltage.

5. The data storage device of claim 4, wherein the bit line controller is configured to write a first logical value to the first resistive memory component by applying the first voltage that is greater than the drain voltage.

6. The data storage device of claim 5, wherein the bit line controller is configured to write a second logical value, that is different from the first logical value, to the first resistive memory component by applying the first voltage that is less than the drain voltage.

* * * * *